United States Patent
Chen et al.

(10) Patent No.: US 10,526,199 B1
(45) Date of Patent: Jan. 7, 2020

(54) HIGH EFFICIENCY GETTER DESIGN IN VACUUM MEMS DEVICE

(71) Applicant: Taiwan Semiconductor Manufacturing Co., Ltd., Hsin-Chu (TW)

(72) Inventors: Ting-Jung Chen, Hsin-Chu (TW); Lee-Chuan Tseng, New Taipei (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 0 days.

(21) Appl. No.: 16/229,736

(22) Filed: Dec. 21, 2018

Related U.S. Application Data (60) Provisional application No. 62/737,296, filed on Sep. 27, 2018.

(51) Int. Cl.
   *B81B 7/00* (2006.01)
   *B81C 1/00* (2006.01)

(52) U.S. Cl.
   CPC ........ *B81B 7/0038* (2013.01); *B81C 1/00285* (2013.01); *B81B 2203/0315* (2013.01); *B81B 2207/012* (2013.01); *B81C 2201/013* (2013.01); *B81C 2203/0785* (2013.01)

(58) Field of Classification Search
   None
   See application file for complete search history.

(56) References Cited

U.S. PATENT DOCUMENTS

2015/0069539 A1* 3/2015 Chan .................. B81C 1/00285
                                                              257/417

OTHER PUBLICATIONS

Martinez, et al. "Titanium Diffusion in Gold Thin Films." Thin Solid Films 518 (2010) 2585-2591, published on Aug. 7, 2009.
Matsuoka, et al. "Low Temperature Au—Au Surface-Activated Bonding Using Nitrogen Atmospheric-Pressure Plasma Treatment for Optical Microsystems." ICEP-IAAC Proceedings, 2015.

* cited by examiner

*Primary Examiner* — Herve-Louis Y Assouman
(74) *Attorney, Agent, or Firm* — Eschweiler & Potashnik, LLC (57) ABSTRACT

An integrated chip including a first substrate, a second substrate overlying the first substrate, and a third substrate overlying the second substrate is provided. The first, second, and third substrates at least partially define a cavity, and the second substrate includes a movable mass in the cavity between the first and third substrates. A getter structure is in the cavity and includes a getter layer and a filter layer. The getter layer comprises a getter material. The filter layer has a first side adjoining the getter layer, and further has a second side that is opposite the first side and that faces the cavity. The filter layer is configured to pass the getter material from the first side to the second side while blocking any impurities.

20 Claims, 7 Drawing Sheets

HIGH EFFICIENCY GETTER DESIGN IN VACUUM MEMS DEVICE

REFERENCE TO RELATED APPLICATION

This application claims the benefit of U.S. Provisional Application No. 62/737,296, filed on Sep. 27, 2018, the contents of which are incorporated by reference in their entirety.

BACKGROUND

Microelectromechanical systems (MEMS) is a technology that integrates miniaturized mechanical and electromechanical elements on an integrated chip. MEMS devices are often made using micro-fabrication techniques. In recent years, MEMS devices have found a wide range of applications. For example, MEMS devices are found in cell phones (e.g., accelerometers, gyroscopes, digital compasses), pressure sensors, micro-fluidic elements (e.g., valves, pumps), optical switches (e.g., mirrors), etc.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

MEMS (microelectromechanical systems) devices often comprise a moveable soft mechanical structure abutting a cavity that allows for the soft mechanical structure to move freely during operation of the MEMS device. According to some processes for forming the MEMS devices, a cavity is formed in a cap substrate and then the cap substrate is bonded to a MEMS substrate. The bonding process is high temperature and at least a portion of the cavity is disposed between the MEMS substrate and the cap substrate. Further, before or after the high temperature bonding process, the MEMS substrate is bonded to a CMOS structure (having one or more transistor devices) using another high temperature bonding process.

It has been appreciated that the above processes for forming the MEMS devices may present a number of practical difficulties. For example, the cap substrate may support a getter layer comprised of a reactive material (e.g., titanium) to prevent outgassing and maintain a vacuum seal on the cavity. The getter layer may be formed by a sputter process that results in impurities within the getter layer (e.g., the getter layer is 75% reactive material and 25% impurities). The impurities within the getter layer may mitigate the reactive material's ability to getter an outgas species (e.g., oxygen ($O_2$), hydrogen ($H_2$), and/or water ($H_2O$)) within the cavity resulting in low getter efficiency, a high getter activation temperature (e.g., 300 degrees Celsius), increase in cavity pressure, and degraded device performance. The low getter efficiency is exacerbated in low temperature conditions (e.g., temperatures less than the high getter activation temperature) due to outgassing of the outgas species while the getter layer may not be gettering. Further, bond ring structures may be used to bond the cap substrate and the MEMS substrate together. However, the bond ring structures may comprise a first discrete layer (e.g., of germanium) over a second discrete layer (e.g., of aluminum copper). The discrete layers may result in bond ring leakage due to a poor bond interface between the first and second discrete layers and/or high temperatures during operation conditions (e.g., high temperatures up to 425 degrees Celsius). Furthermore, the process used to form the getter layer may result in a bottom surface of the getter layer being flat. The moveable soft mechanical structure within the MEMS substrate is more likely to stick to the bottom surface of the getter layer and render the device unstable.

Various embodiments of the present application are directed towards an improved method for forming an integrated chip having a MEMS device. In some embodiments, the improved method includes forming a reactive layer by a sputter process on a first side of a cap substrate, and forming an unreactive layer on the getter layer. The reactive layer comprises a reactive material (e.g., titanium) for gettering, and further comprises impurities. The unreactive layer comprises an unreactive material (e.g., gold). An annealing process is performed to interdiffuse the reactive material and the unreactive material at an interface between the getter layer and the unreactive layer. An etch is performed into the reactive layer, the unreactive layer, and the cap substrate. The etch divides the reactive layer and the unreactive layer into a getter structure and a first bond layer. The getter structure comprises a getter layer and a filter layer, and the first bond layer comprises a bond ring getter and a bond ring filter layer. The getter layer and the bond ring getter correspond to portions of the reactive layer, and the filter layer and the bond ring filter layer correspond to portions of the unreactive layer. The etch further forms an opening in the cap substrate that separates the first bond layer from the getter structure. A thinning process is performed on the filter layer, but not the bond ring getter, and reduce a thickness of the filter layer. A MEMS substrate overlying and bonded to a CMOS substrate is provided. A second bond layer overlies the MEMS substrate. The first side of the cap substrate is bonded to the MEMS substrate at a bond interface between the first and second bond layers. The bonding of the cap substrate to the MEMS substrate is performed at a low temperature (e.g., between approximately 150 degrees Celsius and approximately 200 degrees Celsius). The low temperature bonding defines and seals a cavity between the first side of the cap substrate and the CMOS substrate. The first bond layer and second bond layer comprise the same material (e.g., gold) at the bond interface between the first and second bond layers.

The filter layer is configured to pass the reactive material from the first side of the filter layer to a second side of the filter layer while blocking the impurities. The pure reactive material on the second side of the filter layer getters an outgas species absent an influence of the impurities. Therefore, the pure reactive material on the second side of the filter layer has a lower getter activation temperature (e.g., 200 degrees Celsius) and a higher getter efficiency than the reactive material on the first side of the filter layer. This, in turn, promotes gettering of the outgas species at lower temperatures (e.g., at 200 degrees Celsius instead of 300 degrees Celsius) during formation and/or operation of the device, and further decreases a pressure of the cavity. Further, the first bond layer and the second bond layer comprising gold mitigates outgas sing due to the low temperature bonding process. Furthermore, the second side of the filter layer is rough and acts as an anti-stiction layer, whereby the moveable soft mechanical structure is less likely to stick to the second side of the filter layer.

Figure 1:
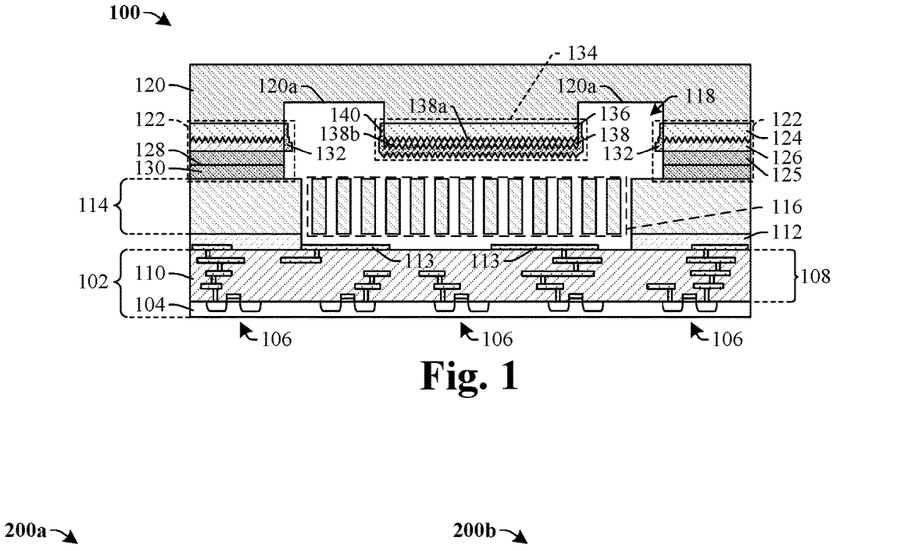
FIG. 1 illustrates a cross-sectional view of some embodiments of an integrated chip including a microelectromechanical systems (MEMS) device with a getter structure.

FIG. 1 illustrates a cross-sectional view of some embodiments of an integrated chip 100 having a microelectromechanical (MEMS) substrate 114 and a getter structure 134.

The integrated chip 100 comprises a CMOS (complementary metal oxide semiconductor) structure 102 having a semiconductor substrate 104 with one or more transistor devices 106 disposed therein. In some embodiments, the one or more transistor devices 106 may be formed by way of a CMOS fabrication process. A back-end-of-the-line (BEOL) metal stack is disposed over the semiconductor substrate 104. The BEOL metal stack comprises a plurality of metal interconnect layers 108. The plurality of metal interconnect layers 108 are coupled to the one or more transistor devices 106, which are disposed within an inter-layer dielectric (ILD) layer 110 comprising one or more dielectric layers. Typically, the plurality of metal interconnect layers 108 comprise metal layers that increase in size as a distance from the semiconductor substrate 104 increases.

A passivation layer 112 is between the CMOS structure 102 and the MEMS substrate 114. The MEMS substrate 114 comprises a plurality of soft movable elements 116 within a cavity 118. The cavity 118 is defined between a first side 120a of a cap substrate 120 and a top surface of the ILD layer 110. At least a portion of the plurality of soft movable elements 116 are over electrodes 113 within the cavity 118. A bond ring structure 122 is between the MEMS substrate 114 and the cap substrate 120. The bond ring structure 122 includes a bottom bond ring 130, a top bond ring 125, a bond ring filter layer 126, and a bond ring getter 124. The bottom bond ring 130 directly contacts the top bond ring 125 at a bond interface 128. In some embodiments, the top and bottom bond rings 125, 130 comprise a same material (e.g., gold). The top and bottom bond rings 125, 130 comprising the same material promotes a uniform bond interface, which mitigates bond ring leakage (e.g., particles entering the cavity 118 from outside outer sidewalls of the bond ring structure 122). This, in turn, causes the cavity 118 to maintain a vacuum seal, and increases stability, endurance, and performance of the integrated chip 100. In some embodiments, the top and bottom bond rings 125, 130 are or comprise gold or some other suitable material, which allows eutectic bonding at low temperatures (e.g., less than 200 degrees Celsius). The low temperatures reduce outgassing during bonding, and the reduced outgassing allows the cavity 118 to better maintain a vacuum seal and increases stability, endurance, and performance of the integrated chip 100. In some embodiments, a bond ring oxidization layer 132 forms on inner sidewalls of the bond ring getter 124. In some embodiments, the bond ring oxidation layer 132 comprises 3 discrete widths. In some embodiments, a width of the bond ring oxidation layer 132 increases from a top surface of the bond ring getter 124 to a top surface of the top bond ring 125.

The getter structure 134 is between inner sidewalls of the bond ring structure 122 within the cavity 118. The getter structure 134 includes a getter layer 136, a filter layer 138, and a getter-structure oxide layer 140. The getter layer 136 (in some embodiments, referred to as an absorptive layer) is comprised of a reactive material (e.g., titanium) and impurities. The getter layer 136 is configured to getter an outgas species within the cavity 118. In some embodiments, the outgas species may, for example, be or comprise oxygen ($O_2$), hydrogen ($H_2$), and/or water ($H_2O$), or the like. Thus, the getter layer 136 is configured to maintain a vacuum seal of the cavity 118 during operation and/or formation of the integrated chip 100. In some embodiments, the outgas species is formed within the cavity 118 due to formation and/or operation of the integrated chip 100. The reactive material reacts with the outgas species within the cavity 118 to form the getter-structure oxide layer 140 along outer sidewalls of the getter layer 136. The presence of impurities within the getter layer 136 mitigates a getter efficiency of the getter layer 136 (e.g., an ability of the reactive material to react with the outgas species). Further, the impurities mitigate a getter temperature of the getter layer 136 (e.g., a temperature in which the reactive material of the getter layer 136 begins to react with the outgas species). This, in turn, impedes absorption of the outgas species and formation of the getter-structure oxide layer 140. Further, preventing/removing the impurities from the getter layer 136 is troublesome because the impurities form within the getter layer 136 during a formation (e.g., a sputtering process) of the reactive material.

A first filter side 138a of the filter layer 138 abuts the getter layer 136. A second filter side 138b of the filter layer 138 abuts the getter-structure oxide layer 140. The filter layer 138 (in some embodiments, referred to as an absorption-enhancement layer) comprises a combination of the reactive material and an unreactive material (e.g., gold). In some embodiments, a concentration of the reactive material within the filter layer 138 continuously decreases from the first filter side 138a to the second filter side 138b. The filter layer 138 is configured to pass the reactive material from the first filter side 138a to the second filter side 138b while blocking the impurities from passing from the getter layer 136 to the first filter side 138a. In some embodiments, the filter layer 138 passes the reactive material from the first filter side 138a to the second filter side 138b and/or opposing outer sidewalls of the filter layer 138. In some embodiments, the reactive material diffuses from the getter layer 136 to the second filter side 138b of the filter layer 138 and reacts with the outgas species to form/add to a thickness of the getter-structure oxide layer 140 in direct contact with the second filter side 138b. Thus, the filter layer 138 enables the reactive material to react with the outgas species without the presences of the impurities. Therefore, the filter layer 138 has a getter efficiency greater than the getter efficiency of the getter layer 136 and a getter temperature (e.g., 200 degrees Celsius) less than the getter temperature of the getter layer 136 (e.g., 300 degrees Celsius).

As the getter efficiency of the filter layer 138 increases, a pressure within the cavity 118 may decrease, thereby aiding in maintaining the vacuum seal within the cavity 118. The getter temperature of the filter layer 138 may, for example, allow the reactive material to react with the outgas species at a lower temperature than the getter temperature of the getter layer 136. Reacting with the outgas species at lower temperatures decreases a final pressure of the cavity 118 during/after formation/operation of the integrated chip 100. In some embodiments, a first pressure of the cavity 118 without the filter layer 138 (not shown) may, for example, be at least twice a second pressure of the cavity 118 with the filter layer 138. In some embodiments, the filter layer 138 functions as a filter configured to pass the reactive material and block the impurities. Therefore, the filter layer 138 decreases a pressure of the cavity 118, which in turn increases a performance, stability, and endurance of the integrated chip 100.

In some embodiments, the filter layer 138 acts as a diffusion layer for the reactive material, such that the reactive material diffuses from the first filter side 138a to the second filter side 138b and the outer sidewalls of the filter layer 138. The filter layer 138 blocks diffusion of the impurities from the first filter side 138a to the second filter side 138b. In some embodiments, the diffusion of the reactive material is onset at the getter temperature of the filter layer 138 (e.g., approximately 200 degrees Celsius) and diffusion of the reactive material across the filter layer 138 increases with temperature. Further, outgassing of the outgas species within the cavity 118 will increase with temperature, thus a pressure in the cavity 118 should increase with temperature. However, the increased diffusion of the reactive material due to increasing temperature may mitigate the increased pressure due to the increased outgassing. This, in turn, maintains a vacuum seal within the cavity 118 while the temperature of the device increases. Accordingly, the increase of diffusion of the reactive material with increasing temperatures mitigates a fluctuation of the getter efficiency of the filter layer 138 with increasing temperatures.

In some embodiments, the bond ring getter 124 and the getter layer 136 may, for example, be or comprise the reactive material (e.g., titanium, ruthenium, zirconium, or the like) and/or may, for example, be formed to a thickness within a range of approximately 10 to 50 nanometers. In some embodiments, the bond ring getter 124 is configured as the getter layer 136 is described above. In some embodiments, the getter layer 136 and the bond ring getter 124 may, for example, have a composition of 90% the reactive material and 10% the impurities, 80% the reactive material and 20% the impurities, or a range of approximately 70-95% the reactive material and approximately 30-5% the impurities. In some further embodiments, the impurities may, for example, be or comprise silver, aluminum, boron, bismuth, calcium, cadmium, carbon, chromium, copper, iron, potassium, lithium, magnesium, manganese, molybdenum, sodium, nickel, phosphorus, lead, silicon, tin, thorium, uranium, vanadium, tungsten, zinc, zirconium, beryllium, mercury, oxygen, nitrogen, hydrogen, chlorine, sulfur, or the like. In some embodiments, the filter layer 138 may, for example, be or comprise a compound of gold and titanium, gold and ruthenium, gold and zirconium, or the like and/or may, for example, be formed to a thickness within a range of approximately 7 to 20 nanometers. In some embodiments, the bond ring filter layer 126 may, for example, be or comprise a compound of gold and titanium, gold and ruthenium, gold and zirconium, or the like and/or may, for example, be formed to a thickness within a range of approximately 25 to 150 nanometers. In some embodiments, the bond ring filter layer 126 is configured as the filter layer 138 is described above. In some embodiments, the getter-structure oxide layer 140 may, for example, be or comprise the reactive material, the outgas species, titanium oxide, ruthenium oxide, zirconium oxide, titanium hydride, ruthenium hydride, zirconium hydride, some other suitable material, or any combination of the foregoing and/or may, for example, comprise a thickness within a range of approximately 10 to 100 nanometers. In some embodiments, the getter-structure oxide layer 140 may be or comprise an oxide and/or a hydride of a material the getter layer 136 is comprised of. In some embodiments, a bottom surface of the getter-structure oxide layer 140 is rough, which in turn reduces the likelihood that the soft movable elements 116 will stick to the getter-structure oxide layer 140 during operation/formation of the integrated chip 100. In some embodiments, the second filter side 138b is rough (e.g., saw toothed), whereby a surface area of the second filter side 138b is higher than if it were flat. The high surface area increase absorption of the outgas species and hence further increases the getter efficiency of the filter layer 138.

In some embodiments, if the filter layer 138 is absent, the getter structure 134 (with only the getter layer 136) is configured to react with the outgas species at a first temperature (e.g., approximately 300 degrees Celsius). In the aforementioned embodiment, when the filter layer 138 is present, the getter structure 134 (with both the getter layer 136 and the filter layer 138) is configured to react with the outgas species at a second temperature (e.g., approximately 200 degrees Celsius) less than the first temperature. In further embodiments, if the filter layer 138 is absent, the getter structure 134 (with only the getter layer 136) has a first getter efficiency (e.g., approximately 70-95 percent). In the aforementioned embodiment, when the filter layer 138 is present, the getter structure 134 (with both the getter layer 136 and the filter layer 138) has a second getter efficiency (e.g., approximately 95-100 percent) greater than the first getter efficiency.

Figure 2A:
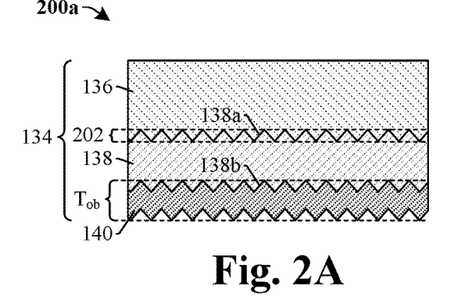
FIGS. 2A-2D illustrate cross-sectional views of some alternative embodiments of the getter structure of FIG. 1.

With reference to FIG. 2A, a cross-sectional view 200a of a getter structure 134 according to some alternative embodiments of the getter structure 134 of FIG. 1 is provided in which the getter-structure oxide layer 140 is absent along outer sidewalls of the getter layer 136.

The getter layer 136 comprises a plurality of protrusions within an interface region 202 that directly contact a plurality of recesses defined along a first filter side 138a of the filter layer 138. It may be appreciated that FIG. 2A is merely an example and the interface region 202 could have many different profiles. A second filter side 138b of the filter layer 138 is in direct contact with a top surface of the getter-structure oxide layer 140. A bottom surface of the getter-structure oxide layer 140 is rough and/or comprises a plurality of protrusions. A thickness $T_{ob}$ defined between a topmost point of the getter-structure oxide layer 140 and a bottommost point of the getter-structure oxide layer 140 is within a range of approximately 10 to 100 nanometers.

Figure 2B:
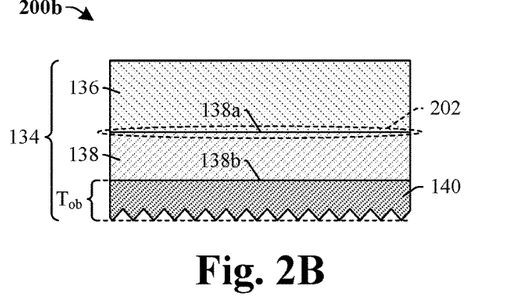

With reference to FIG. 2B, a cross-sectional view 200b of a getter structure 134 according to some alternative embodiments of the getter structure 134 of FIG. 1 is provided in which the second filter side 138b is flat or substantially flat.

The getter layer 136 directly contacts a first filter side 138a of the filter layer 138 at an interface region 202 that is flat or substantially flat. It may be appreciated that FIG. 2A is merely an example and the interface region 202 could have many different profiles. A second filter side 138b of the filter layer 138 is in direct contact with a top surface of the getter-structure oxide layer 140 at a flat or substantially flat interface. A bottom surface of the getter-structure oxide layer 140 is rough and/or comprises a plurality of protrusions. A thickness $T_{ob}$ defined between the top surface of the getter-structure oxide layer 140 and a bottommost point of the getter-structure oxide layer 140 is within a range of approximately 10 to 100 nanometers.

Figure 2C:
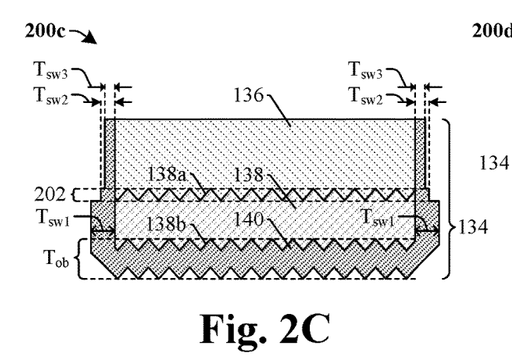

With reference to FIG. 2C, a cross-sectional view 200c of a getter structure 134 according to some alternative embodiments of the getter structure 134 of FIG. 1 is provided in which the getter-structure oxide layer 140 comprises three discrete thicknesses.

The getter structure 134 includes a getter layer 136, a filter layer 138, and a getter-structure oxide layer 140. The getter-structure oxide layer 140 has a U-shape and encloses outer sidewalls of the getter layer 136 and the filter layer 138. A thickness $T_{ob}$ of the getter-structure oxide layer 140 defined between a bottommost point of the getter-structure oxide layer 140 and a topmost point of the second filter side 138b is within a range of approximately 10 to 100 nanometers. A thickness $T_{sw1}$ of the getter-structure oxide layer 140 is defined below an interface region 202, at outer sidewalls of the filter layer 138, and is within a range of approximately 10 to 100 nanometers. A thickness $T_{sw2}$ of the getter-structure oxide layer 140 is defined at the interface region 202 and is within a range of approximately 10 to 50 nanometers. A thickness $T_{sw3}$ of the getter-structure oxide layer 140 is defined above the interface region 202, at outer sidewalls of the getter layer 136, and is within a range of approximately 0.1 to 2 nanometers.

In some embodiments, a difference in the thicknesses (e.g., $T_{sw1}$, $T_{sw2}$, $T_{sw3}$) in the getter-structure oxide layer 140 is due to an ability of the reactive material to diffuse to a surface of the getter layer 136 and/or the filter layer 138 and react with the outgas species. The reactive material within the filter layer 138 below the interface region 202 is able to react with the outgas species without influence from the impurities because the filter layer 138 blocks the impurities, and therefore has the largest thickness range. The reactive material within the interface region 202 may be partially impeded due to a presence of impurities within the getter layer 136, thus causing the thickness $T_{sw2}$ to be smaller than the thickness $T_{sw1}$. The reactive material within the getter layer 136 above the interface region 202 is influenced by the impurities when reacting with the outgas species, and therefore has the smallest thickness. In some embodiments, the thickness $T_{ob}$ is approximately equal to the thickness $T_{sw1}$. In some embodiments, the thickness $T_{ob}$ is greater than the thickness $T_{sw1}$, the thickness $T_{sw1}$ is greater than the thickness $T_{sw2}$, and the thickness $T_{sw2}$ is greater than the thickness $T_{sw3}$. In some embodiments, the thickness $T_{ob}$ is at least two times greater than the thickness $T_{sw1}$. The thickness $T_{sw1}$ is at least 2 times greater than the thickness $T_{sw2}$, and the thickness $T_{sw2}$ is at least 4 times greater than the thickness $T_{sw3}$.

Figure 2D:
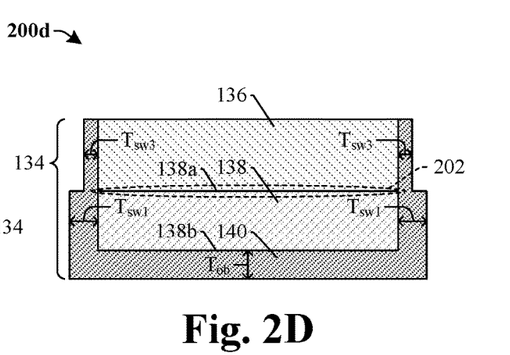

With reference to FIG. 2D, a cross-sectional view 200d of a getter structure 134 according to some alternative embodiments of the getter structure 134 of FIG. 1 is provided in which the getter-structure oxide layer 140 comprises two discrete thicknesses.

The getter-structure oxide layer 140 has a U-shape and encloses outer sidewalls of the getter layer 136 and the filter layer 138. A thickness $T_{ob}$ of the getter-structure oxide layer 140 is defined between a bottom surface of the filter layer 138 and a bottom surface of the getter-structure oxide layer 140 and is within a range of approximately 10 to 100 nanometers. A thickness $T_{sw1}$ of the getter-structure oxide layer 140 is defined below an interface region 202, at outer sidewalls of the filter layer 138, and is within a range of approximately 10 to 100 nanometers. A thickness $T_{sw3}$ of the getter-structure oxide layer 140 is defined above the interface region 202, at outer sidewalls of the getter layer 136, and is within a range of approximately 0.1 to 2 nanometers. In some embodiments, a bottom surface of the getter-structure oxide layer 140 is rough (not shown in FIG. 2D).

Figure 3:
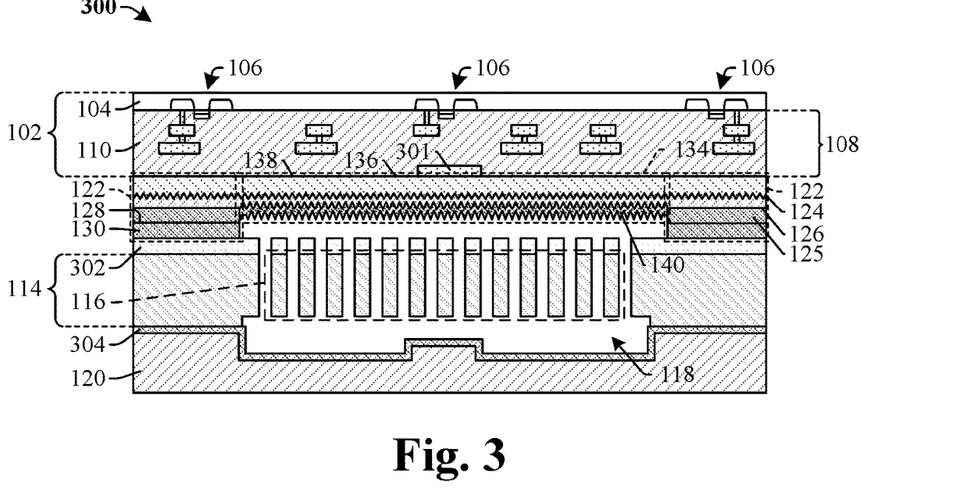
FIG. 3 illustrates a cross-sectional view of some alternative embodiments of the integrated chip of FIG. 1 in which the getter structure contacts a bond ring structure.

With reference to FIG. 3, a cross-sectional view of an integrated chip 300 according to some alternative embodiments of the integrated chip 100 of FIG. 1 is provided in which the getter structure 134 is in direct contact with the bond ring structure 122.

The CMOS structure 102 overlies the getter structure 134, such that a metal layer 301 in the plurality of metal interconnect layers 108 is in direct contact with the getter layer 136. Outer sidewalls of the getter structure 134 are in direct contact with inner sidewalls of the bond ring structure 122. A polysilicon layer 302 is between the bond ring structure 122 and the MEMS substrate 114. The polysilicon layer 302 overlies the soft movable elements 116. A lower oxide layer 304 is between the polysilicon layer 302 and the cap substrate 120. In some embodiments, a top surface of the polysilicon layer 302 is rough (e.g., has a saw-toothed profile or some other suitable profile) and is configured to mitigate stiction between the soft movable elements 116 and the getter structure 134.

Figure 4:
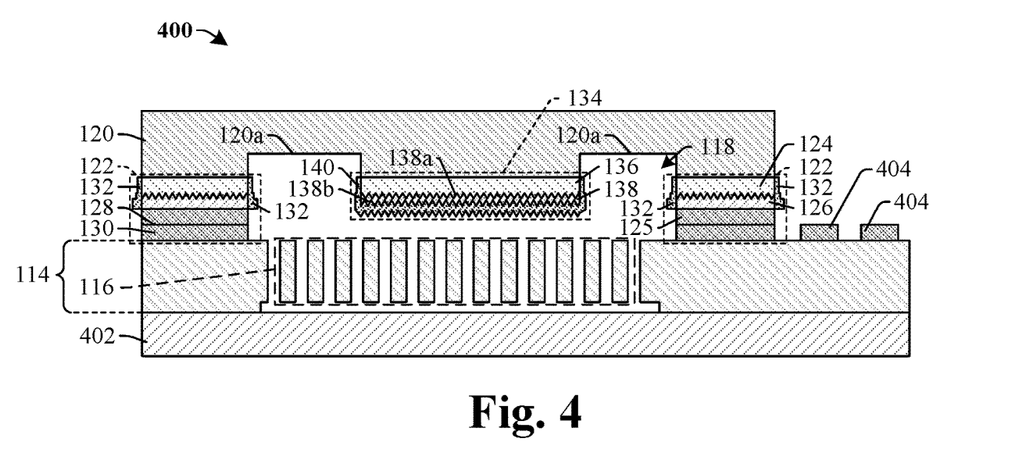
FIG. 4 illustrates a cross-sectional view of some alternative embodiments of the integrated chip of FIG. 1 in which contact pads overlie a MEMS substrate.

With reference to FIG. 4, a cross-sectional view of an integrated chip 400 according to some alternative embodiments of the integrated chip 100 of FIG. 1 is provided in which contact pads 404 overly the MEMS substrate 114.

The MEMS substrate 114 overlies an integrated circuit (IC) die 402. In some embodiments, the IC die 402 comprises a substrate with a plurality of devices (e.g., transistors, varactors, resistors, capacitors, inductors, etc.) disposed within the IC die 402 and electrically coupled to the MEM MEMS substrate 114 via an interconnect structure (not shown). A plurality of contact pads 404 are disposed over an upper surface of the MEMS substrate 114. In some embodiments, the plurality of contact pads 404 respectively provide an ohmic contact with devices in the MEMS substrate 114 and/or the IC die 402. In some embodiments, the plurality of contact pads 404 are comprised of a same material as the bottom bond ring 130. In some embodiments, a top surface of the plurality of contact pads 404 are aligned with a top surface of the bottom bond ring 130. In some embodiments, the bond ring oxidation layer 132 forms on outer sidewalls of the bond ring structure 122.

Figure 5:
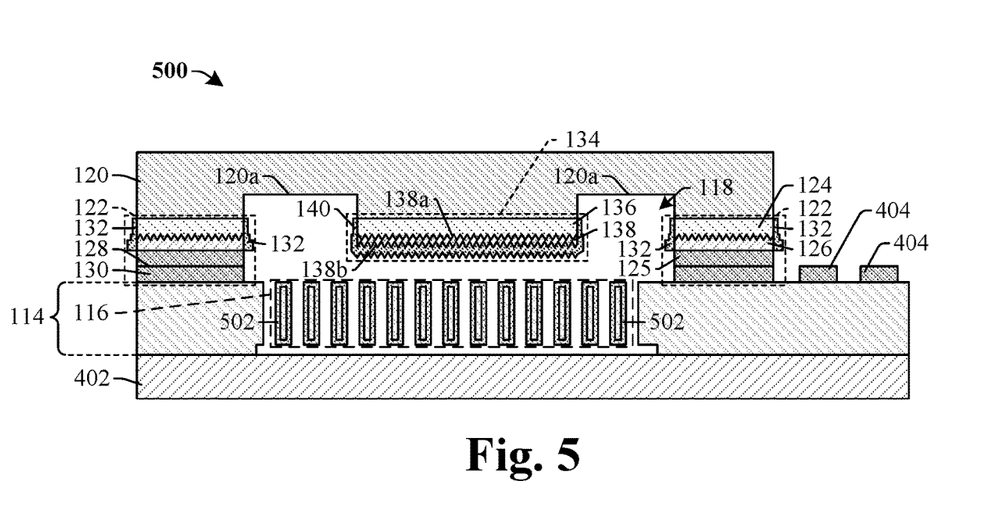
FIG. 5 illustrates a cross-sectional view of some alternative embodiments of the integrated chip of FIG. 1 in which a self-assembled monolayer (SAM) encloses a plurality of soft movable elements.

With reference to FIG. 5, a cross-sectional view of an integrated chip 500 according to some alternative embodiments of the integrated chip 100 of FIG. 1 is provided in which a self-assembled monolayer (SAM) 502 encloses the plurality of soft movable elements 116.

The SAM 502 surrounds and conformally encloses the plurality of soft movable elements 116. The SAM 502 acts as an anti-stiction layer between the plurality of soft movable elements 116 and the getter-structure oxide layer 140. Further, the SAM 502 acts as an anti-stiction layer between the plurality of soft movable elements 116 and the IC die 402. In some embodiments, the top and bottom bond rings 125, 130 are or comprise gold or some other suitable material, which allows eutectic bonding at low temperatures (e.g., less than about 200 degrees Celsius). The low temperatures used to bond the top bond ring 125 to the bottom bond ring 130 may, for example, reduce the likelihood that the SAM 502 will delaminate from the MEMS substrate 114. In some embodiments, when a high bond temperature (e.g., approximately 425 degrees Celsius) is used to bond the top bond ring 125 to the bottom bond ring 130, the SAM 502 may delaminate. For example, when the SAM 502 comprises silicon-chlorine, the SAM 502 may delaminate from the plurality of soft movable elements 116 due to the high bond temperature.

FIGS. 6-12 illustrate cross-sectional views 600-1200 of some embodiments of a method of forming an integrated chip including a microelectromechanical systems (MEMS) device with a getter structure according to the present disclosure. Although the cross-sectional views 600-1200 shown in FIGS. 6-12 are described with reference to a method, it will be appreciated that the structures shown in FIGS. 6-12 are not limited to the method but rather may stand alone separate of the method. Although FIGS. 6-12 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part. In some embodiments, FIGS. 6-12 may, for example, be employed to form the integrated chip 100 of FIG. 1.

Figure 6:
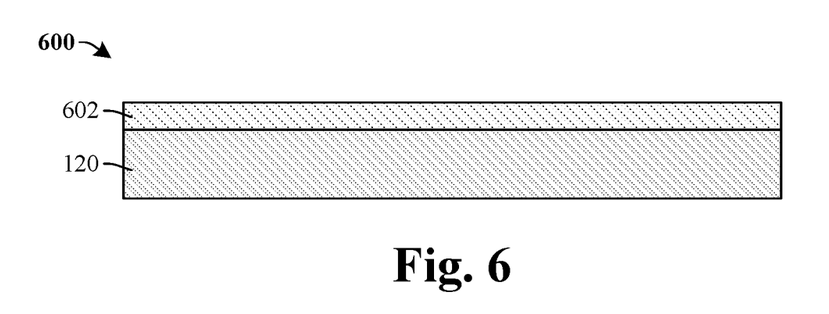
FIGS. 6-12 illustrate cross-sectional views of some embodiments of forming an integrated chip including a microelectromechanical systems (MEMS) device with a getter structure.

As shown in cross-sectional view 600 of FIG. 6, a reactive layer 602 is formed over a cap substrate 120. In some embodiments, the reactive layer 602 is formed by a sputter process. In some embodiments, the reactive layer 602 is comprised of a reactive material and impurities. The impurities may, for example, form inherently and/or undesirably from use of the sputter process. In some further embodiments, the impurities from the reactive material source may, for example, be or comprise silver, aluminum, boron, bismuth, calcium, cadmium, carbon, chromium, copper, iron, potassium, lithium, magnesium, manganese, molybdenum, sodium, nickel, phosphorus, lead, silicon, tin, thorium, uranium, vanadium, tungsten, zinc, zirconium, beryllium, mercury, or the like. In yet further embodiments, the impurities from a fabrication environment and/or tool used to form the reactive material over the cap substrate 120 may, for example, be or comprise oxygen, carbon, nitrogen, hydrogen, chlorine, sulfur, or the like. In some embodiments, the reactive layer 602 is formed with a temperature within a range of approximately 100 to 125 degrees Celsius.

In some embodiments, the reactive material may, for example, be titanium, ruthenium, zirconium, or the like and/or may, for example, be formed to a thickness within a range of approximately 10 to 50 nanometers. In some embodiments, the reactive layer 602 may, for example, have a composition of 90% the reactive material and 10% the impurities, 80% the reactive material and 20% the impurities, or a range of approximately 70-95% the reactive material and approximately 30-5% the impurities. The cap substrate 120 may be, for example, a bulk substrate (e.g., a bulk silicon substrate), monocrystalline silicon, P doped silicon, or N doped silicon.

Figure 7:
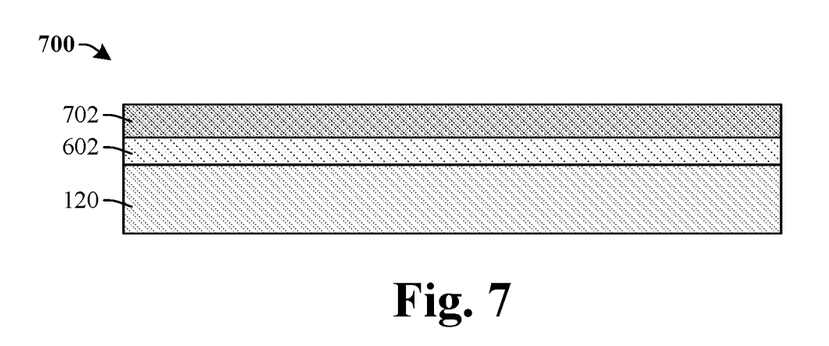

As shown in cross-sectional view 700 of FIG. 7, an unreactive layer 702 is formed over the reactive layer 602. In some embodiments, the unreactive layer 702 may, for example, be or comprise an unreactive material (e.g., gold or the like) and/or may, for example, be formed to a thickness within a range of approximately 200 to 800 nanometers. In some embodiment, the unreactive layer 702 is or comprises a material that blocks the impurities of the reactive layer 602 from diffusing through the unreactive layer 702 while also allowing the reactive material of the reactive layer 602 to diffuse or otherwise move through the unreactive layer 702. In some embodiments, the unreactive layer 702 is formed with a temperature within a range of approximately 100 to 125 degrees Celsius.

Figure 8:
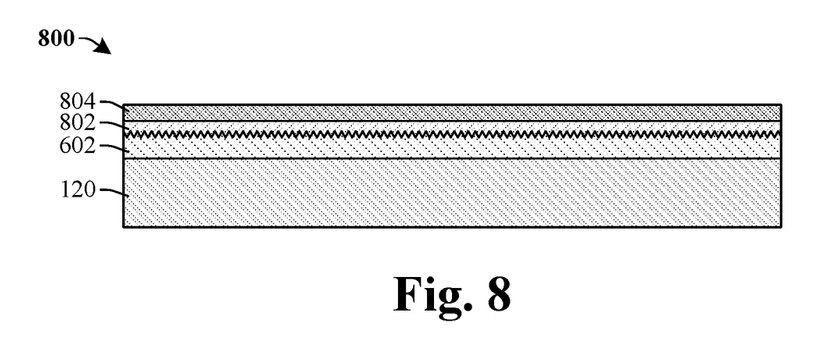

As shown in cross-sectional view 800 of FIG. 8, an annealing process is performed to inter diffuse or otherwise combine the unreactive material from the unreactive layer (702 of FIG. 7) with the reactive material from the reactive layer 602, thereby defining a reactive filter layer 802. In some embodiments, the annealing process reaches a maximum temperature of approximately 250 degrees Celsius. In some further embodiments, the annealing process comprises a temperature within a range of approximately 150 to 250 degrees Celsius. In some embodiments, the reactive filter layer 802 may, for example, be or comprise a compound of the reactive material and the unreactive material and/or may, for example, be formed to a thickness within a range of approximately 7-20 nanometers. Such a compound may, for example, be or comprise titanium gold ($TiAu_3$), ruthenium gold, zirconium gold, or the like. An unreactive film 804 is over the reactive filter layer 802 and comprises unreactive material from the unreactive layer (702 of FIG. 7) that did not combine with the reactive material while performing the annealing process. In some embodiments, the unreactive film 804 may, for example, be or comprise the unreactive material and/or may, for example, be formed to a thickness within a range of approximately 180 to 780 nanometers.

Figure 9:
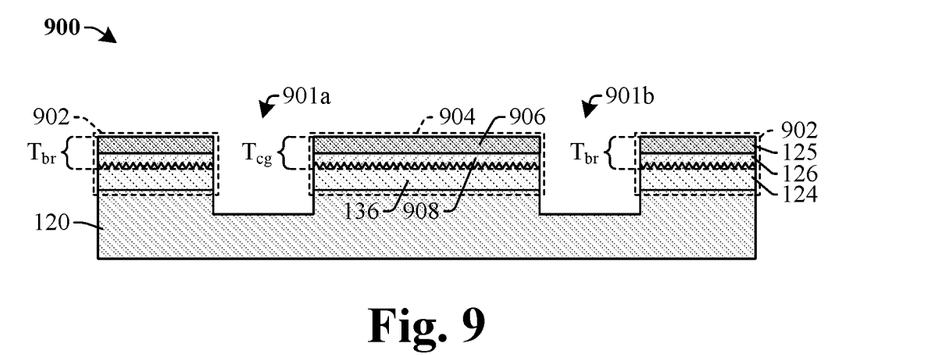

As shown in cross-sectional view 900 of FIG. 9, an etching process is performed into the reactive layer (602 of FIG. 8), the reactive filter layer (802 of FIG. 8), the unreactive film (804 of FIG. 8), and the cap substrate 120 to define a first opening 901a, a second opening 901b, a top bond structure 902, and a multi-layer getter structure 904. The top bond structure 902 includes: a top bond ring 125; a bond ring filter layer 126 underlying the top bond ring 125; and a bond ring getter 124 underlying the bond ring filter layer 126. Further, the bond ring getter 124 directly contacts the cap substrate 120. A thickness $T_{br}$ of the bond ring filter layer 126 and the top bond ring 125 may, for example, be within a range of approximately 200 to 800 nanometers. The multi-layer getter structure 904 includes a center unreactive layer 906, a center reactive filter layer 908, and a getter layer 136. A thickness $T_{cg}$ of the center reactive filter layer 908 and the center unreactive layer 906 may, for example, be within a range of approximately 200 to 800 nanometers. In some embodiments, the etching process is performed by: forming a masking layer (not shown) over the unreactive film (804 of FIG. 8); performing an etch according to the masking layer to define the first and second openings 901a, 901b; and removing the masking layer. In some embodiments, when viewed top down, the first opening 901a and the second opening 901b are segments of a ring-shaped trench encircling the multi-layer getter structure 904.

Figure 10:
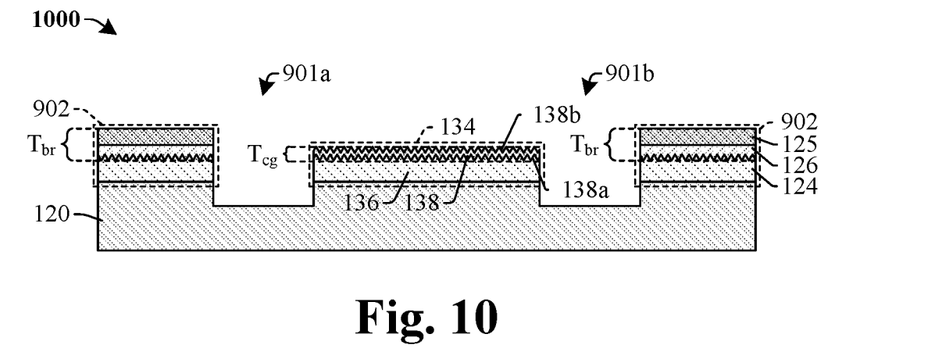

As shown in cross-sectional view 1000 of FIG. 10, an etching process is performed into the multi-layer getter structure (904 of FIG. 9) to remove the center unreactive layer (906 of FIG. 9) and to remove a portion of the center reactive filter layer 908 defining the filter layer 138 and the getter structure 134. The etching process assists in making a second filter side 138b of the filter layer 138 rough, which reduces the likelihood of stiction. In some embodiments, the etching process reduces the thickness $T_{cg}$ to within a range of approximately 7 to 20 nanometers. In some embodiments, the etching process does not reduce the thickness $T_{br}$ of the top bond ring structure 902. In some embodiments, the etching process is performed by: forming a masking layer (not shown) over the cap substrate 120 and the top bond structure 902; performing an etch according to the masking layer to remove the center unreactive layer (906 of FIG. 9) and reduce a thickness of the center reactive filter layer (908 of FIG. 9); and removing the masking layer.

In some embodiments, after/during each of the previous steps outlined in FIGS. 6-10, the reactive material may react with the outgas species and form oxidation on any surface of the reactive layer (602 of FIG. 6), the unreactive layer (702 of FIG. 7), the reactive filter layer (802 of FIG. 8), the unreactive film (804 of FIG. 8), the multi-layer getter structure (904 of FIG. 9), the top bond structure 902, the getter structure 134, or any combination of the foregoing exposed to air. Thus, in some embodiments, a cleaning process is performed after each step and/or any sub-steps of FIGS. 6-10 to remove the oxidation. The cleaning process may mitigate delamination issues caused by the presence of oxidation before forming layers over one another and/or bonding layers together.

Figure 11:
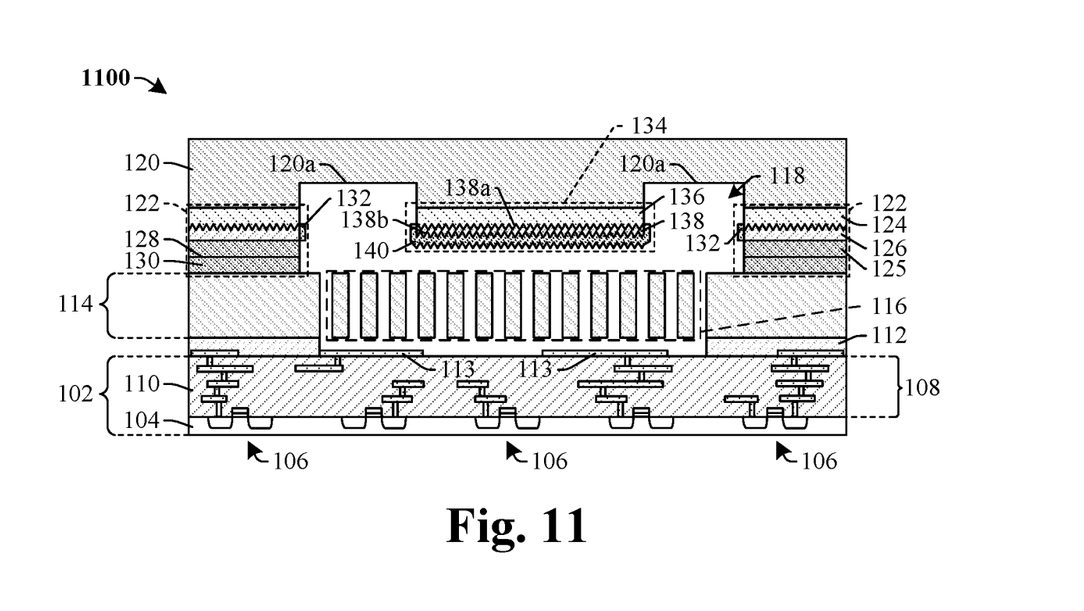

As shown in cross-sectional view 1100 of FIG. 11, the structure from FIG. 10 is rotated 180 degrees and bonded to a bottom bond ring 130 overlying a MEMS substrate 114, thereby forming and sealing a cavity 118. The bonding process includes: aligning the top bond ring 125 over the bottom bond ring 130; bringing the top and bottom bond rings 125, 130 into contact; and performing an annealing process to bond the top bond ring 125 to the bottom bond ring 130 along a bond interface 128. The top and bottom bond rings 125, 130 are comprised of a same material (e.g., gold or some other suitable material), such that the bond interface 128 comprises the same material. In some embodiments, the bonding process reaches a maximum temperature of approximately 200 degrees Celsius. In some embodiments, the maximum temperature of the bonding process is less than a getter activation temperature of the getter layer 136 (e.g., 300 degrees Celsius) and greater than or equal to a getter activation temperature of the filter layer 140 (e.g., 200 degrees Celsius). For example, the filter layer 138 may getter the outgas species within the cavity 118 during the bonding process and the getter layer 136 may not getter the outgas species within the cavity 118 during the bonding process. Thus, the getter-structure oxide layer 140 will form around a bottom surface of the filter layer 138 and outer sidewalls of the filter layer 138. In some embodiments, the bottom bond ring 130 may, for example, be or comprise gold and/or may, for example, be formed to a thickness within a range of approximately 500 to 1000 nanometers.

Figure 12:
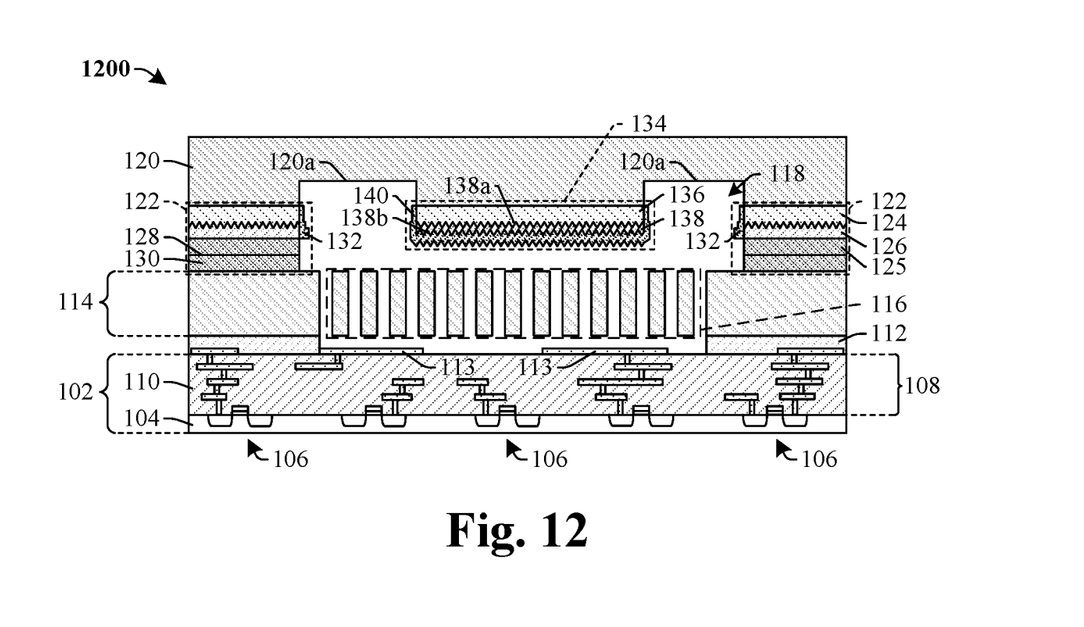

As shown in cross-sectional view 1200 of FIG. 12, oxidation occurs along sidewalls of the getter layer 136 and sidewalls of the bond ring getter 124 during subsequent processing steps and/or operation of the integrated chip. In some embodiments, the oxidation along sidewalls of the getter layer 136 occurs at processing and/or operation temperatures greater than the getter activation temperature of the getter layer 136. In some embodiments, oxidation along a surface of the filter layer 138 may, for example, occur after 5,000 cycles of the integrated chip. In some embodiments, oxidation along a surface of the getter layer 136 may, for example, occur after 10,000 cycles of the integrated chip.

The filter layer 138 is configured to pass the reactive material from the first filter side 138a to the second filter side 138b while blocking the impurities from passing from the getter layer 136 to the first filter side 138a. Thus, the filter layer 138 enables the reactive material to react with the outgas species within the cavity 118 without the presence of the impurities. Therefore, the filter layer 138 has a getter efficiency greater than the getter efficiency of the getter layer 136. The getter efficiency of the filter layer 138 may decrease a pressure within the cavity 118, thereby aiding in maintaining a vacuum seal within the cavity 118.

Figure 13:
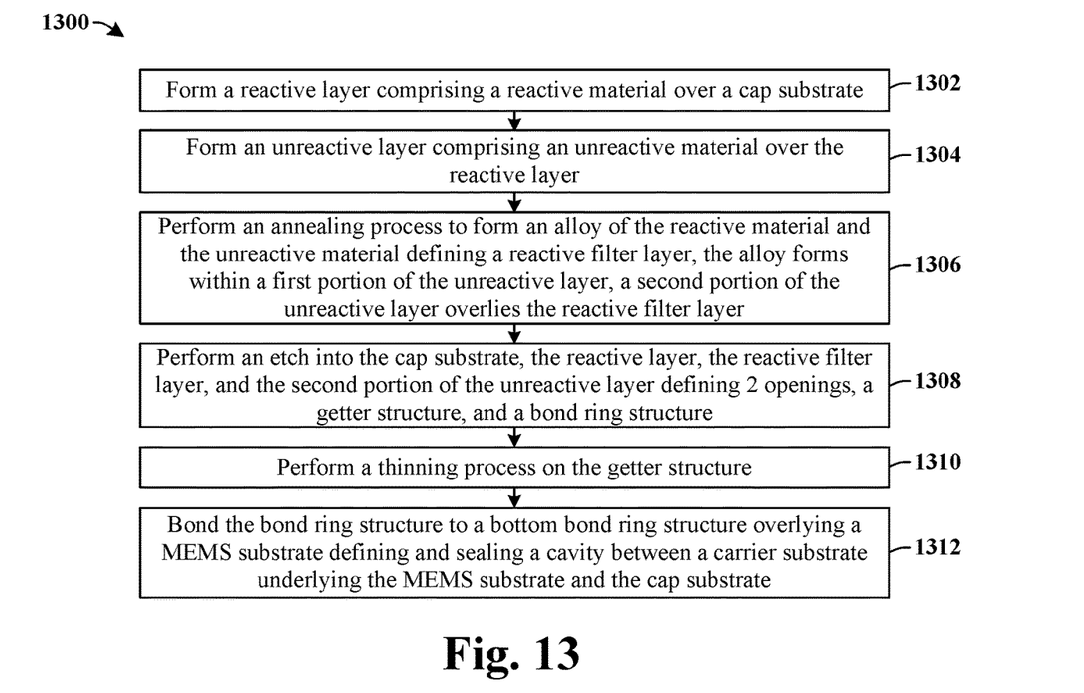
FIG. 13 illustrates a flowchart of some embodiments of the method of FIGS. 6-12.

FIG. 13 illustrates a flow diagram of some additional embodiments of a method 1300 of forming an integrated chip including a microelectromechanical systems (MEMS) device with a getter structure.

While the disclosed method 1300 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1302, a reactive layer comprising a reactive material is formed over a cap substrate. FIG. 6 illustrates a cross-sectional view corresponding to some embodiments of act 1302.

At 1304, an unreactive layer comprising an unreactive material is formed over the reactive layer. FIG. 7 illustrates a cross-sectional view corresponding to some embodiments of act 1304.

At 1306, an annealing process is performed to form an alloy of the reactive material and the unreactive material. The alloy defines a reactive filter layer and forms within a first portion of the unreactive layer. A remaining second portion of the unreactive layer overlies the reactive filter layer. FIG. 8 illustrates a cross-sectional view corresponding to some embodiments of act 1306.

At 1308, an etching process is performed into the cap substrate, the reactive layer, the reactive filter layer, and the second portion of the unreactive layer to define two openings, a getter structure, and a bond ring structure. FIG. 9 illustrates a cross-sectional view corresponding to some embodiments of act 1308.

At 1310, a thinning process is performed on the getter structure to remove the second portion of the unreactive layer overlying the reactive filter layer and a portion of the reactive filter layer, thereby defining a filter layer with a rough top surface. FIG. 10 illustrates a cross-sectional view corresponding to some embodiments of act 1310.

At 1312, a bond process is performed to bond the bond ring structure to a bottom bond ring structure. The bottom bond ring structure overlies a MEMS substrate and the bond processes defines and seals a cavity between a carrier substrate underlying the MEMS substrate and the cap substrate. FIG. 11 illustrates a cross-sectional view corresponding to some embodiments of act 1312.

Accordingly, in some embodiments, the present application relates to a MEMS device with an enhanced getter structure. The enhanced getter structure includes a filter layer and a getter layer. The filter layer comprises an unreactive material, whereas the getter layer comprises a reactive material and impurities. Further, a first side of a filter layer abuts the getter layer, and a second side of the filter layer faces a cavity within which a MEMS device is. The filter layer is configured to pass the reactive material from the first side to the second side of the filter layer while blocking the impurities.

In various embodiments, the present application provides an integrated chip including: a first substrate; a second substrate overlying the first substrate; a third substrate overlying the second substrate, wherein the first, second, and third substrates at least partially define a cavity, and wherein the second substrate comprises a movable mass in the cavity and between the first and third substrates; and a getter structure in the cavity and including a getter layer and a filter layer, wherein the getter layer comprises a getter material, wherein the filter layer has a first side adjoining the getter layer, and further has a second side that is opposite the first side and that faces the cavity, and wherein the filter layer is configured to pass the getter material from the first side to the second side while blocking any impurities.

In various embodiments, the present application provides an integrated chip including: a carrier substrate; a capping substrate overlying the carrier substrate; a micro-electromechanical systems (MEMS) substrate sandwiched between the carrier substrate and the capping substrate, wherein the carrier substrate, the capping substrate, and the MEMS substrate at least partially define a cavity, and wherein the MEMS substrate comprises a movable mass in the cavity and between the carrier substrate and the capping substrate; and a getter structure in the cavity and including a getter layer, an oxide layer, and a diffusion layer, wherein the getter layer comprises a first material, the oxide layer comprises an oxide of the first material, and the diffusion layer comprises a second material, and wherein the diffusion layer is between the getter and oxide layers.

In various embodiments, the present application provides a method of forming an integrated chip, the method including: forming a multilayer film on a capping substrate, wherein the multilayer film comprises an absorptive layer including a first material, and further comprises an absorption-enhancement layer including a second material different from the first material; performing an etching process into the multilayer film to delineate a bond-ring portion of the multilayer film and a getter portion of the multilayer film; performing a thinning process into the getter portion of the multilayer film to reduce a thickness of the absorption-enhancement layer at the getter portion without reducing the thickness of the absorption-enhancement layer at the bond-ring portion; and bonding the multilayer film to a MEMS structure, such that the getter portion overlies a movable mass in the MEMS structure and seals a cavity within which the movable mass is in.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip comprising:
a first substrate;
a second substrate overlying the first substrate;
a third substrate overlying the second substrate, wherein the first, second, and third substrates at least partially define a cavity, and wherein the second substrate comprises a movable mass in the cavity and between the first and third substrates; and
a getter structure in the cavity and comprising a getter layer and a filter layer, wherein the getter layer comprises a getter material, wherein the filter layer has a first side adjoining the getter layer, and further has a second side that is opposite the first side and that faces the cavity, and wherein the filter layer is configured to pass the getter material from the first side to the second side while blocking any impurities.

2. The integrated chip according to claim 1, wherein the getter material is configured to react with an outgas species in the cavity to form an oxide layer on the second side of the filter layer.

3. The integrated chip according to claim 2, wherein the filter layer comprises gold, the getter material comprises titanium, and the outgas species comprises oxygen.

4. The integrated chip according to claim 2, wherein outer sidewalls of the getter layer are aligned with outer sidewalls of the filter layer.

5. The integrated chip according to claim 1, further comprising:
a bond-ring structure between the second substrate and the third substrate, wherein the bond-ring structure comprises a first bond-ring layer overlying a second bond-ring layer, wherein the first bond-ring layer comprises the getter material and the second bond-ring layer comprises a material different from the getter material, and wherein the getter structure is laterally between inner sidewalls of the bond-ring structure.

6. The integrated chip according to claim 1, wherein a bottom surface of the getter layer comprises a plurality of protrusions, wherein the first side of the filter layer comprises a plurality of recesses that meet the plurality of protrusions.

7. The integrated chip according to claim 1, wherein the second side of the filter layer has a rough surface.

8. The integrated chip according to claim 1, wherein the getter material passes from a top surface of the filter layer to a bottom surface of the filter layer.

9. The integrated chip according to claim 1, wherein the getter material passes from the first side to opposing outer sidewalls of the filter layer.

10. An integrated chip comprising:
a carrier substrate;
a capping substrate overlying the carrier substrate;

a micro-electro-mechanical systems (MEMS) substrate sandwiched between the carrier substrate and the capping substrate, wherein the carrier substrate, the capping substrate, and the MEMS substrate at least partially define a cavity, and wherein the MEMS substrate comprises a movable mass in the cavity and between the carrier substrate and the capping substrate; and a getter structure in the cavity and including a getter layer, an oxide layer, and a diffusion layer, wherein the getter layer comprises a first material, the oxide layer comprises an oxide of the first material, and the diffusion layer comprises a second material, and wherein the diffusion layer is between the getter and oxide layers.

11. The integrated chip according to claim 10, wherein the first material is titanium, ruthenium, or zirconium, and the second material is gold.

12. The integrated chip according to claim 10, wherein outer sidewalls of the getter layer and outer sidewalls of the diffusion layer are aligned, and wherein the oxide layer lines the outer sidewalls of the getter and diffusion layers.

13. The integrated chip according to claim 10, wherein the oxide layer has a U-shape and directly contacts outer sidewalls of the getter layer, outer sidewalls of the diffusion layer, and a bottom surface of the diffusion layer.

14. The integrated chip according to claim 13, wherein a first width of the oxide layer along the outer sidewalls of the getter layer is less than a second width of the oxide layer along the outer sidewalls of the diffusion layer.

15. The integrated chip according to claim 14, wherein the oxide layer directly contacts an interface between a lower surface of the getter layer and an upper surface of the diffusion layer, wherein the oxide layer comprises a third width at the interface, and wherein the third width is greater than the first width and less than the second width.

16. The integrated chip according to claim 10, further comprising:
a bond-ring structure between the MEMS substrate and the capping substrate, wherein the bond-ring structure has a pair of sidewall segments, wherein the sidewall segments are in the cavity and are on opposite sides of the cavity, and wherein the integrated chip further comprises:
a bond ring oxide layer directly contacting the sidewall segments, wherein the bond ring oxide layer comprises a same material as the oxide layer.

17. The integrated chip according to claim 16, wherein the bond-ring structure comprises:
a bottom bond ring region;
a bond ring getter region overlying the bottom bond ring region; and
a bond ring diffusion region sandwiched between the bond ring getter region and the bottom bond ring region;
wherein the bond ring oxide layer extends from an upper surface of the bond ring getter region to an upper surface of the bottom bond ring region, wherein the bond ring oxide layer has a first oxide width from the upper surface of the bond ring getter region to a lower surface of the bond ring getter region, and further has a second oxide width from the lower surface of the bond ring getter region to the upper surface of the bottom bond ring region, and wherein the first oxide width is less than the second oxide width.

18. A method of forming an integrated chip, comprising:
forming a multilayer film on a capping substrate, wherein the multilayer film comprises an absorptive layer comprising a first material, and further comprises an absorption-enhancement layer comprising a second material different from the first material;
performing an etching process into the multilayer film to delineate a bond-ring portion of the multilayer film and a getter portion of the multilayer film;
performing a thinning process into the getter portion of the multilayer film to reduce a thickness of the absorption-enhancement layer at the getter portion without reducing the thickness of the absorption-enhancement layer at the bond-ring portion; and
bonding the multilayer film to a MEMS structure, such that the getter portion overlies a movable mass in the MEMS structure and seals a cavity within which the movable mass is in.

19. The method according to claim 18, wherein the forming of the multilayer film comprises:
depositing the first material on the capping substrate to form the absorptive layer;
depositing the second material on the absorptive layer to form the absorption-enhancement layer; and
performing an annealing process to form a compound of the first and second materials in the absorption-enhancement layer.

20. The method according to claim 19, wherein the multilayer film has a getter activation temperature, and wherein the bonding reaches a maximum bonding temperature greater than or equal to the getter activation temperature.

* * * * *